(12) United States Patent
Li et al.

(10) Patent No.: US 9,159,581 B2
(45) Date of Patent: Oct. 13, 2015

(54) METHOD OF MAKING A SEMICONDUCTOR DEVICE USING A BOTTOM ANTIREFLECTIVE COATING (BARC) LAYER

(71) Applicant: TAIWAN SEMICONDUCTOR MANUFACTURING COMPANY, LTD., Hsinchu (TW)

(72) Inventors: Tsai-Chun Li, Hsinchu (TW); Bi-Ming Yen, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/686,413

(22) Filed: Nov. 27, 2012

(65) Prior Publication Data

US 2014/0145313 A1    May 29, 2014

(51) Int. Cl.
*H01L 21/311* (2006.01)
*H01L 21/768* (2006.01)

(52) U.S. Cl.
CPC .... *H01L 21/31144* (2013.01); *H01L 21/31116* (2013.01); *H01L 21/31138* (2013.01); *H01L 21/76816* (2013.01)

(58) Field of Classification Search
CPC ............... H01L 21/0338; H01L 21/31144; H01L 21/3144; H01L 21/0276; H01L 21/31116; H01L 21/31138; H01L 21/32139; H01L 21/76816; H01L 21/0274; H01L 21/0337; H01L 21/76804; H01L 21/76802; G03F 7/091
USPC ............... 216/41; 257/773, E23.01, E21.257; 438/703, 701, 710; 430/311–313
See application file for complete search history.

(56) References Cited

U.S. PATENT DOCUMENTS

| | | | | |
|---|---|---|---|---|
| 4,814,041 A | * | 3/1989 | Auda | 438/712 |
| 5,376,228 A | * | 12/1994 | Yanagida | 438/714 |
| 5,753,418 A | * | 5/1998 | Tsai et al. | 430/313 |
| 5,843,845 A | * | 12/1998 | Chung | 438/713 |
| 6,514,867 B1 | * | 2/2003 | Hui et al. | 438/713 |
| 6,514,868 B1 | * | 2/2003 | Hui et al. | 438/713 |
| 6,774,032 B1 | * | 8/2004 | Park | 438/640 |

(Continued)

OTHER PUBLICATIONS

Patel et. al.., "Comparative study of line width roughness (LWR) in next generation lithography processes", Proc. SPIE 7640, Optical Microlithography XXIII, 76400T (Mar. 12, 2010).*

(Continued)

*Primary Examiner* — Marvin Payen
*Assistant Examiner* — Victor Barzykin
(74) *Attorney, Agent, or Firm* — Hauptman Ham, LLP (57) ABSTRACT

This description relates to a method of making a semiconductor device including forming an inter-level dielectric (ILD) layer over a substrate and forming a layer set over the ILD layer. The method further includes etching the layer set to form a tapered opening in the layer set and etching the ILD layer using the layer set as a mask to form an opening in the ILD layer. The opening in the ILD layer has a line width roughness (LWR) of less than 3 nanometers (nm). This description also relates to a semiconductor device including an inter-level dielectric (ILD) layer over a substrate; and a layer set over the ILD layer. The layer set has a tapered opening within the layer set. Etching the layer set comprises forming the tapered opening having sidewalls at an angle with respect to a top surface of the ILD layer ranging from 85-degrees to 90-degrees.

20 Claims, 5 Drawing Sheets

(56) References Cited

U.S. PATENT DOCUMENTS

| | | | |
|---|---|---|---|
| 6,858,542 B2* | 2/2005 | Sparks et al. | 438/701 |
| 7,030,008 B2* | 4/2006 | Allen et al. | 438/637 |
| 7,297,628 B2* | 11/2007 | Chao et al. | 438/635 |
| 7,514,362 B2* | 4/2009 | Pinnow et al. | 438/672 |
| 7,545,041 B2* | 6/2009 | Allen et al. | 257/751 |
| 7,728,384 B2* | 6/2010 | Ho et al. | 257/351 |
| 7,799,511 B2* | 9/2010 | Chou et al. | 430/313 |
| 8,168,374 B2* | 5/2012 | Chou et al. | 430/316 |
| 8,252,192 B2* | 8/2012 | Lee et al. | 216/47 |
| 2003/0129539 A1* | 7/2003 | Tsai et al. | 430/311 |
| 2003/0134231 A1* | 7/2003 | Tsai et al. | 430/312 |
| 2004/0009662 A1* | 1/2004 | Park et al. | 438/640 |
| 2004/0087153 A1* | 5/2004 | Du et al. | 438/689 |
| 2006/0000796 A1* | 1/2006 | Tan et al. | 216/37 |
| 2006/0046495 A1* | 3/2006 | Frohberg et al. | 438/706 |
| 2007/0010099 A1* | 1/2007 | Du et al. | 438/706 |
| 2008/0064203 A1* | 3/2008 | Chou et al. | 438/637 |
| 2008/0102643 A1* | 5/2008 | Chen et al. | 438/710 |
| 2008/0248429 A1* | 10/2008 | Chou et al. | 430/311 |
| 2009/0035944 A1* | 2/2009 | Chiang et al. | 438/703 |
| 2009/0314743 A1* | 12/2009 | Ma | 216/51 |
| 2010/0304569 A1* | 12/2010 | Chou et al. | 438/702 |
| 2011/0174774 A1* | 7/2011 | Lin et al. | 216/41 |
| 2012/0161327 A1* | 6/2012 | Chumakov et al. | 257/773 |
| 2012/0184105 A1* | 7/2012 | Chou et al. | 438/703 |
| 2012/0244710 A1* | 9/2012 | Chumakov et al. | 438/701 |
| 2012/0302056 A1* | 11/2012 | Chen et al. | 438/636 |
| 2012/0315748 A1* | 12/2012 | Chang et al. | 438/585 |
| 2013/0137269 A1* | 5/2013 | Geiss et al. | 438/697 |

OTHER PUBLICATIONS

Cho et al., "Reduction in Line Width and Edge Roughness by Using a Resist Reflow Process for Extreme Ultraviolet Lithography", Journal of Korean Physical Society, vol. 56, pp. 1767-1771 (2010).*

* cited by examiner

METHOD OF MAKING A SEMICONDUCTOR DEVICE USING A BOTTOM ANTIREFLECTIVE COATING (BARC) LAYER

RELATED APPLICATIONS

This application is related to U.S. application Ser. No. 13/714,756, entitled "METHOD OF MAKING A SEMICONDUCTOR DEVICE USING MUTLIPLE LAYER SETS", filed on Dec. 14, 2012, which is hereby incorporated by reference in its entirety.

BACKGROUND

As technology nodes shrink more emphasis is placed on the ability to reduce the distance between features in a semiconductor device. Reducing the distance between features is limited by the uniformity of the features in the semiconductor device because of the risk of short circuits forming between adjacent features. A minimum distance between features to have an acceptable risk of short circuits is called a critical dimension. Processes which yield a highly uniform feature facilitate smaller critical dimensions. Processes which yield features having low uniformity result in larger critical dimensions.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
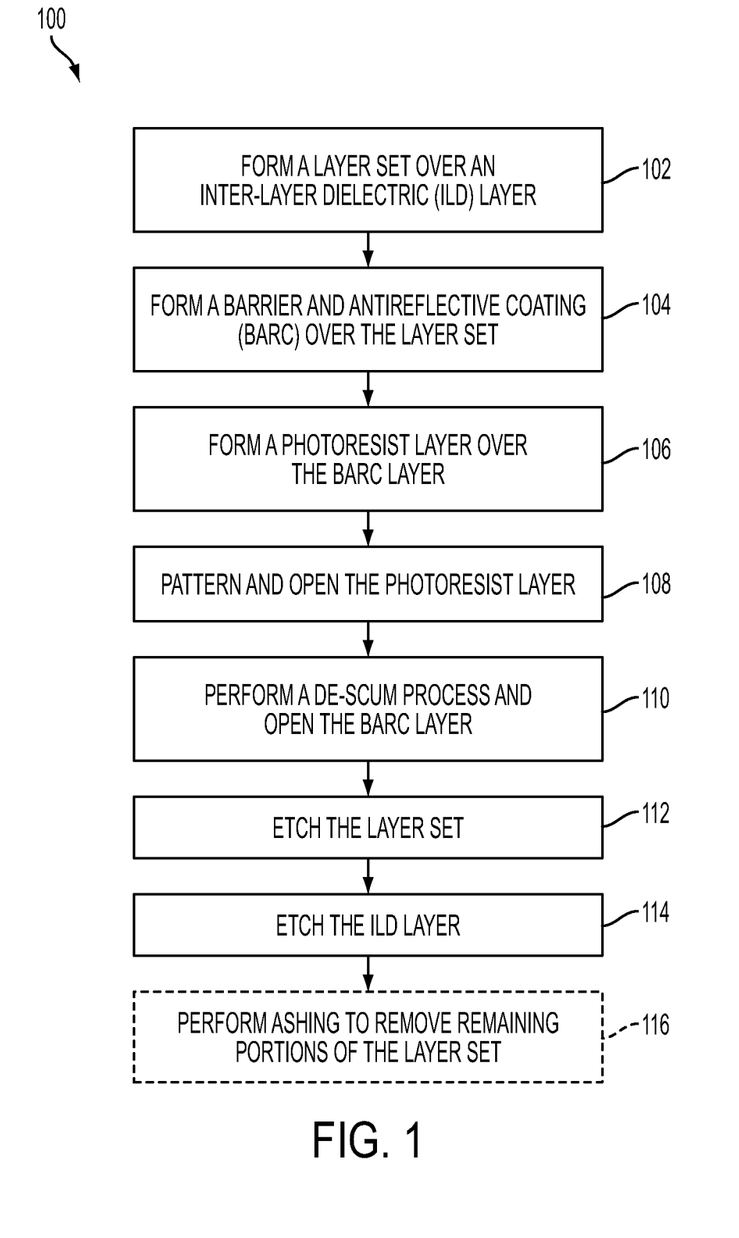
FIG. 1 is a flow chart for a method of patterning a semiconductor device using multiple layer sets, in accordance with one or more embodiments.
Figure 2A:
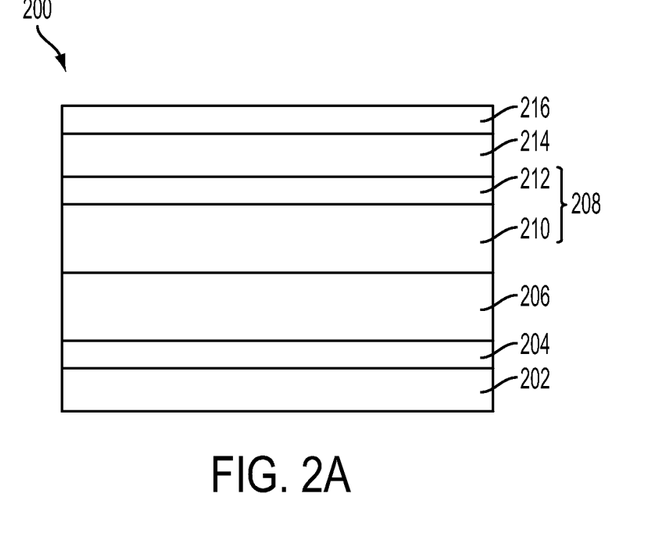
FIGS. 2A-2F are cross-sectional views of the semiconductor device during various points of the method of FIG. 1, in accordance with one or more embodiments.
Figure 2B:
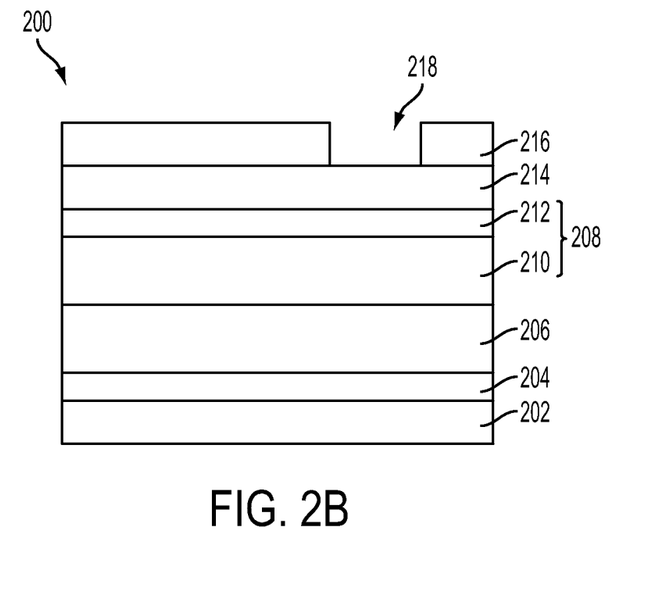
Figure 2C:
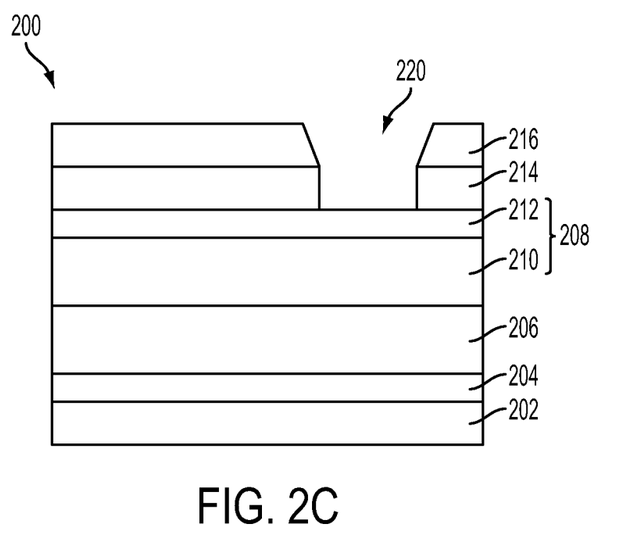
Figure 2D:
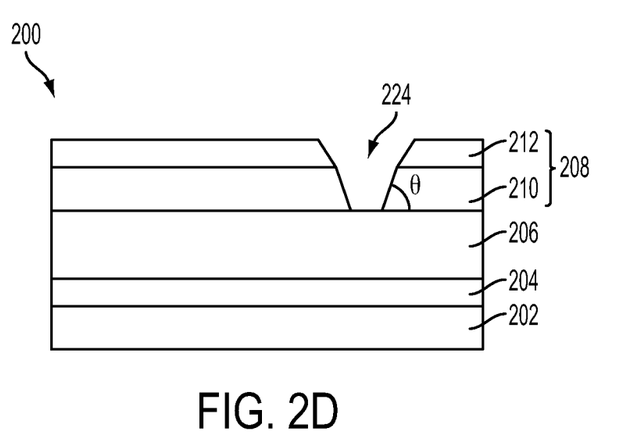
Figure 2E:
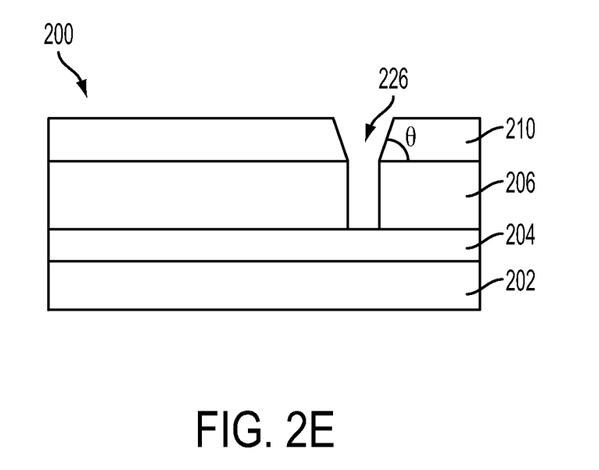
Figure 2F:
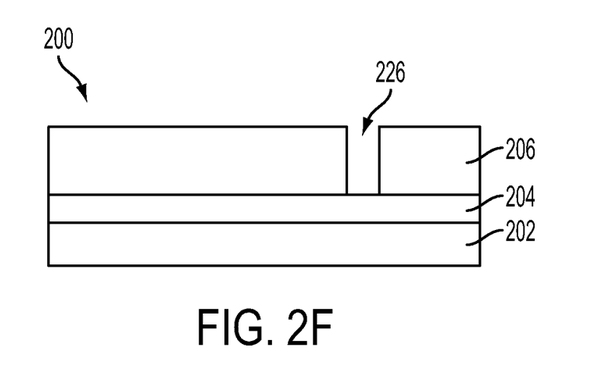

FIGS. 1-2F are directed to the formation of a single feature; however, one of ordinary skill in the art would recognize the process is usable to form a plurality of similar features simultaneously.

Electrical interconnections between various components of the semiconductor device are formed within an inter-level dielectric (ILD) layer. The ILD layer is etched to create openings, such as holes or trenches, for features which are later metalized in order to provide a conductive path for electrical signals to connect the various components. The uniformity of the openings etched into the ILD layer factors into a determination of how closely packed the openings are able to be formed to avoid short circuits forming between adjacent metalized features. In some techniques, the uniformity of the openings is measured using a line width roughness (LWR) parameter. As the LWR parameter increases, the critical dimension also increases in order to prevent short circuits. In some techniques, a single layer set deposited over the ILD layer is used to define a pattern for the openings in the ILD layer during the etching process.

Another factor which influences the critical dimension is a wavelength of a light source used during a lithography process. As the wavelength of the light source decreases, the critical dimension also decreases. However, as the wavelength of the light source increases, the LWR parameter increases partially counteracting the reduced critical dimension.

Line width roughness (LWR) is a parameter used to measure uniformity of a feature. LWR is calculated by measuring a width of a plurality of features at several points along each feature. The measured widths are then averaged to obtain an average feature width. LWR is the difference between a largest measured width and the average feature width. As the number of features measured or the number of points measured along each feature increases, the accuracy of the LWR measurement increases. However, the increased number of measurements will also increase processing time.

LWR impacts the critical dimension of semiconductor devices because features having a low LWR are capable of being more densely placed in a semiconductor device. The uniformity of features in a semiconductor device facilitates more accurate modeling of the separation between features to achieve a desired resistance and capacitance performance mitigating a need to account for as large of an amount of manufacturing error.

FIG. 1 is a flow chart for a method 100 of patterning a semiconductor device using multiple layer sets, in accordance with one or more embodiments. Method 100 begins with step 102 in which a layer set is formed over an inter-level dielectric (ILD) layer. In some embodiments, the layer set comprises a plurality of layers. Increasing a number of layers in the layer set reduces the LWR of the final feature formed in the ILD layer. However, as the number of layers within the layer set increases, production cost increases due to greater material consumption and production yield decreases due an increased number of etching operations. In some embodiments, each layer of the layer set is formed using a same process, e.g., physical vapor deposition (PVD), atomic layer deposition (ALD), sputtering, chemical vapor deposition (CVD) or other suitable processes. In some embodiments having a plurality of layers, at least one layer of the layer set is formed by a different process than at least another layer of the layer set.

Method 100 continues with optional step 104 in which a bottom anti-reflective coating (BARC) layer is formed over the layer set. In some embodiments, the BARC layer is formed using a PVD, ALD, sputtering, CVD, spin-on coating, or other suitable process.

Method 100 continues with step 106 in which a photoresist layer is formed over the BARC layer. In some embodiments, the photoresist layer is formed by spin-on coating or other suitable processes. The photoresist layer is formed to have a thickness greater than the BARC layer.

FIG. 2A is a cross sectional view of a semiconductor device 200 after step 106 of method 100, in accordance with one or more embodiments. Semiconductor device 200 includes a substrate 202, an etch stop layer (ESL) 204 over substrate 202 and an ILD layer 206 over the ESL. In some embodiments, ESL 204 is omitted and ILD layer 206 is over substrate 202. A layer set 208 is over ILD layer 206. Layer set 208 includes two layers, a bottom layer 210 and a top layer 212. In some embodiments, layer set 208 includes more than two layers. In some embodiments, layer set 208 includes a single layer. A BARC layer 214 is over layer set 208. A photoresist layer 216 is over BARC layer 214.

In some embodiments, substrate 202 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 202 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

In some embodiments, ESL 204 comprises silicon nitride (SiN), silicon oxynitride (SiON), silicon carbide (SiC), silicon carbon nitride (SiCN), boron nitride (BN), silicon boron nitride (SiBN), silicon carbon boron nitride (SiCBN), combinations thereof, or other suitable materials. In some embodiments, ESL 204 is formed by gas cluster ion beams (GCIBs), PVD, ALD, sputter, CVD, or other suitable processes. In some embodiments, ESL 204 is a contact etch stop layer (CESL).

In some embodiments, ILD layer 206 comprises silicon oxide and/or low-k dielectric materials with a dielectric constant less than about 4. In some embodiments, ILD layer 206 has a k value less than 3.5. In some embodiments, ILD layer 206 has a k value less than 2.5. Suitable low-k dielectric materials include fluorinated silica glass (FSG); carbon doped silicon oxide, BLACK DIAMOND® (Applied Materials of Santa Clara, Calif.), xerogel, aerogel, amorphous fluorinated carbon, parylene, bis-benzocyclobutenes (BCB), SILK® (Dow Chemical, Midland, Mich.), polyimide, porous polymeric materials, silicon oxide doped with material other than fluorine or carbon, other suitable materials or combinations thereof. In some embodiments, ILD layer 206 is formed by high density plasma (HDP) deposition, sub-atmospheric pressure CVD (SACVD), low pressure CVD (LPCVD), ALD, plasma enhanced ALD (PEALD), plasma enhanced CVD (PECVD), monolayer deposition (MLD), plasma impulse CVD (PICVD), spin-on, or other suitable processes.

Layer set 208 comprises top layer 212 and bottom layer 210. In some embodiments, top layer 212 comprises a silicon-rich photoresist material. In some embodiments, top layer 212 comprises SiON, silicon oxycarbide (SiOC), silicon oxide (SiO), spin-on glass, SiN or other suitable materials. In some embodiments, top layer 212 comprises a silicon rich organic compound. In some embodiments, the silicon rich organic compound has a silicon content of 40 weight % or more. Top layer 212 has a thickness ranging from 10 nanometers (nm) to 20 nm. For example, if the thickness of top layer 212 is reduced below 10 nm, the top layer will be unintentionally removed during processing of layers located above the top layer(s), in some instances, in some embodiments. If the thickness of top layer 212 is greater than 20 nm, an aspect ratio of an opening formed in the top layer is unnecessarily increased which increases the complexity of etching bottom layer 210, in some embodiments. If the thickness of top layer 212 is above 20 nm, production costs increase due to longer etching times and greater material consumption, in some embodiments.

In some embodiments, bottom layer 210 comprises a carbon-rich organic material. In some embodiments, bottom layer 210 comprises an organic material, spin-on carbon, SiON, or other suitable materials. In some embodiments, bottom layer 210 comprises a non-chemically amplified polymethylmethacrylate (PMMA). In some embodiments, bottom layer 210 is thicker than top layer 212. Bottom layer 210 has a thickness ranging from 30 nm to 100. For example, if the thickness of bottom layer 210 is less than 30 nm, the bottom layer will be removed prior to completion of etching ILD layer 206 which would increase a critical dimension of features formed in the ILD layer, in some embodiments. If the thickness of bottom layer 210 is greater than 100 nm, the aspect ratio of an opening in the bottom layer increases and the critical dimension of the features formed in ILD layer 206 becomes more difficult to control, in some embodiments. In some embodiments, the thickness of bottom layer 210 ranges from 50 nm to 100 nm to provide more precise control of the critical dimension of features formed in ILD layer 206.

BARC layer 214 reduces reflection of light during a lithography process to increase the precision of patterns formed in photoresist layer 216. BARC layer 214 also acts as a mask layer for opening layer set 208. In some embodiments, BARC layer 214 comprises an organic material. In some embodiments, BARC layer 214 comprises a polymer material having a carbon ratio of greater than 80% by weight. In some embodiments, BARC layer 214 comprises SiON. In some embodiments, BARC layer 214 is formed by spin-on coating. In some embodiments, BARC layer 214 is formed by CVD, PVD, ALD, or other suitable processes. BARC layer 214 has a thickness ranging from 10 nm to 30 nm. If the thickness of BARC layer 214 is below 10 nm, then the BARC layer is removed during a subsequent de-scum process thereby preventing the BARC layer from acting as a mask during the etching of layer set 208. For example, if the thickness of BARC layer 214 is greater than 30 nm, production costs are increased as a result of unnecessary consumption of material and increased processing time to form an opening in the BARC layer, in some embodiments.

Photoresist layer 216 is used to define a pattern to be transferred to ILD layer 206 through BARC layer 214, and layer set 208. Photoresist layer 216 comprises either a positive photoresist material or a negative photoresist material. In some embodiments, photoresist layer 216 is an extreme ultraviolet (EUV) photoresist material. In some embodiments, photoresist layer 216 is a deep ultraviolet (DUV) photoresist material. In some embodiments, photoresist layer 216 comprises an organic or inorganic polymer having a molecular weight ranging from 2,000 to 20,000. In some embodiments, photoresist layer 216 has a thickness ranging from 35 nm to 50 nm. The thickness of photoresist layer 216 is greater than the thickness of BARC layer 214. For example, if the thickness of photoresist layer 216 is less than 35 nm, the photoresist layer will be removed during opening of BARC layer 214, which results in inaccurate transfer of the pattern of the photoresist layer to ILD layer 206, in some embodiments. If the thickness of photoresist layer 216 is greater than 50 nm, production costs are increased as a result of unnecessary consumption of material and increased processing time to pattern and open the photoresist layer, in some embodiments.

Returning to FIG. 1, method 100 continues with step 108 in which an opening is formed in the photoresist layer. The photoresist layer is patterned using a lithography process. In some embodiments, the lithography process is an EUV lithography process which involves light emitted at a wavelength of approximately 13.5 nm. The small wavelength of the EUV light enables a denser patterning of the photoresist layer in comparison with light having longer wavelengths. The increased pattern density reduces the critical dimension of the semiconductor device and facilitates technology node shrinkage. In some embodiments, the lithography process is a deep ultraviolet (DUV) lithography process which involves light emitted at a wavelength ranging from 193 nm to 248 nm. The DUV lithography process facilitates a lower LWR parameter than processes involving light having a shorter wavelength.

The opening in the photoresist layer is formed by etching the patterned photoresist layer to form a mask for the underlying layers. The etching process is either a wet etching or a dry etching process. In some embodiments, an etchant used during the photoresist layer etching process is tetrafluoromethane ($CF_4$).

FIG. 2B is a cross sectional view of semiconductor device 200 following step 108, in accordance with one or more embodiments. An opening 218 is formed in photoresist layer 216. Opening 218 corresponds to a pattern to be transferred to ILD layer 206 during subsequent processing. Opening 218 exposes a portion of BARC layer 214 below photoresist layer 216.

Method 100 continues with step 110 in which a de-scum process is performed and an opening is formed in the BARC layer. The de-scum process removes any trace amounts of photoresist layer in the opening formed in step 108. The de-scum process includes bombarding an exposed surface of the BARC layer with plasma ions to discharge charges built up in the BARC layer during processing of the photoresist layer. In some embodiments, a supply gas for the plasma ions is nitrogen ($N_2$), oxygen ($O_2$), argon (Ar), or other suitable gases. In some embodiments, the de-scum process has an oxygen gas flow rate ranging from 50 standard cubic centimeters per minute (sccm) to 100 sccm, a plasma power ranging from 0.6 kilowatts (kW) to 1.0 kW, a plasma frequency ranges from 13.46 Hertz (Hz) to 13.66 Hz, and a pressure ranging from 30 miliTorr (mTorr) to 60 mTorr.

The de-scum process will also remove at least a portion of the exposed BARC layer. Any remaining portion of the exposed BARC layer is then removed by an additional etching process to form an opening in the BARC layer. The etching process is either a wet etching or a dry etching process. In some embodiments, $CF_4$ is used as an etchant to form the opening in the BARC layer.

FIG. 2C is a cross sectional view of semiconductor device 200 following step 110, in accordance with one or more embodiments. An opening 220 extends through photoresist layer 216 and BARC layer 214 to expose a portion of layer set 208. In the embodiment of FIG. 2C, a portion of top layer 212 is exposed by opening 220.

Method 100 continues with step 112 in which the layer set is etched to form an opening. The etching process transfers the pattern of the BARC layer to the layer set. The etching process also removes the photoresist layer and the BARC layer to expose a top surface of the layer set. The etching process is a wet etching or dry etching process. In some embodiments where the layer set includes a plurality of layers, a different etching process is used for at least one of the layers of the layer set. In some embodiments, a single etching process is used to etch the entire layer set. In some embodiments, an etchant is used for forming the opening in the layer set is $CF_4$. In some embodiments, the $CF_4$ etchant is mixed with trifluoromethan ($CHF_3$) or difluoromethane ($CH_2F_2$) for more precise control of the dimensions of the opening. In some embodiments, the etchant used for the forming the opening in the layer set comprises a mixture of carbonyl sulfide (COS), $O_2$, $N_2$ and Ar. In some embodiments, a flow rate of COS ranges from 5 standard cubic centimeters per minute (sccm) to 50 sccm, a flow rate of $O_2$ ranges from 2 sccm to 150 sccm, a flow rate of $N_2$ ranges from 100 sccm to 300 sccm and a flow rate of Ar ranges from 100 sccm to 300 sccm.

The etching process forms a tapered opening in the layer set. The tapered opening is wider at a side of the layer set furthest from the ILD layer. In some embodiments, an angle θ between a sidewall of the tapered opening and a top surface of the layer set ranges from about 85-degrees to less than 90-degrees. For example, if the angle is less than 85-degrees, the aspect ratio of the second layer set increases the difficulty of etching the ILD layer during a subsequent etching process, in some embodiments. If the angle is greater than 90-degrees, the tapered opening is wider at an interface of the layer set and ILD layer set which increases dimensions of the opening formed during subsequent etching of the ILD layer, in some embodiments. The increased dimensions of the opening will increase the critical dimension of the semiconductor device.

FIG. 2D is a cross sectional view of semiconductor 200 following step 112, in accordance with one or more embodiments. The etching process forms an opening 224 in layer set 208 and exposes a portion of ILD layer 206. The etching process of step 112 also removes photoresist layer 216 and BARC layer 214. Sidewalls of opening 224 are tapered such that opening 224 is wider at a top surface of layer set 208 furthest from ILD layer 206. An angle θ between the sidewalls of opening 224 and a top surface of ILD layer 206 ranges from about 85-degrees to about 90-degrees, but less than 90-degrees. In some embodiments, opening 224 in top layer 212 is also tapered. In some embodiments, an angle between sidewalls of opening 224 in top layer 212 and an interface between bottom layer 210 and the top layer is less than angle θ.

In the embodiment of FIG. 2D, an etchant used to etch top layer 212 is $CF_4$ and an etchant used to etch bottom layer 210 is the mixture of COS, $O_2$, $N_2$ and Ar. In some embodiments, an etching recipe used to etch top layer 212 comprises 80 sccm to 120 sccm of $CF_4$ and 10 sccm to 50 sccm of $CHF_3$ along with dichloro-silane (DCS). In some embodiments, an etching recipe used to etch top layer 212 comprises 100 sccm of $CF_4$ along with DCS. The etching recipe which includes $CHF_3$ provides a more tapered profile of opening 224 in top layer 212, than the recipe without $CHF_3$. In some embodiments, the etching process for top layer 212 is carried out under a pressure of 10 mTorr to 80 mTorr, a source power ranging from 200 Watts (W) to 400 W, and a bias power ranging from 0 W to 50 W. In some embodiments, an etching recipe used to etch bottom layer 210 comprises a flow rate of COS ranges from 5 standard cubic centimeters per minute (sccm) to 50 sccm, a flow rate of $O_2$ ranges from 2 sccm to 150 sccm, a flow rate of $N_2$ ranges from 100 sccm to 300 sccm and a flow rate of Ar ranges from 100 sccm to 300 sccm. In some embodiments, an etching recipe used to etch bottom layer 210 comprises 20 sccm of COS, 20 sccm of $O_2$, 200 sccm of $N_2$ and 200 sccm of Ar. In some embodiments, the etching process for bottom layer 210 is carried out under a pressure of 5 mTorr to 30 mTorr, a source power ranging from 400 W to 800 W, and a bias power ranging from 0 W to 50 W.

The inventors believe the COS in the etchant acts to provide a degree of protection for sidewalls of opening 224. The protection of the sidewalls of opening causes an etching rate in a direction perpendicular to the top surface of ILD layer 206 is greater than an etching rate in a direction parallel to the top surface of the ILD layer. The result is tapered opening 224.

The tapered opening helps to increase uniformity in openings formed in ILD layer 206 by decreasing an aspect ratio of opening 224 at a top portion of the opening. The decreased aspect ratio helps etchant reach the top surface of ILD layer 206 during subsequent processing. By increasing the amount of etchant reaching the top surface of ILD layer 206, the processing time for the subsequent etching of the ILD layer decreases. The decreased processing time in turn lead to less etching of the sidewalls of opening 224, so that a constant width is imparted to the opening formed in ILD layer 206.

A width of opening 224 adjacent to ILD 206 is determined by the critical dimension of the lithography process and a size of a feature formed in ILD 206. A lithography process having a shorter wavelength enables formation of features having a smaller critical dimension resulting in a smaller width for opening 224. A width of opening 224 adjacent top layer 212 depends on the width of opening 224 adjacent ILD 206 and a thickness of bottom layer 210. A width difference between the width of opening 224 adjacent top layer 212 and the width of opening 224 adjacent ILD 206 is independent of the critical dimension or the size of the feature formed in ILD 206. The width difference ranges, for example, from substantially zero, where angle θ is close to 90-degrees regardless of the thickness of bottom layer 210, to 17.48 nanometers, where angle θ is 85-degrees and the thickness of bottom layer 210 is 100 nm.

For example, if a width of opening 224 adjacent to ILD 206 is 28 nanometers and the thickness of bottom layer 210 is 100 nanometers, the width of opening 224 adjacent top layer 212 ranges from 28 nanometers to 45.48 nanometers. As the thickness of bottom layer 210 decreases, the width difference also decreases for angles less than 90-degrees. For example, if a width of opening 224 adjacent to ILD 206 is 28 nanometers and the thickness of the bottom layer 210 is 30 nanometers, the width of opening 224 adjacent top layer 212 ranges from 28 nanometers to 33.24 nanometers. In the above example, a percent change of the width of opening 224 ranges from 18.7%, where the thickness of bottom layer 210 is 30 nanometers, to 62.4%, where the thickness of the bottom layer is 100 nm.

Method 100 continues with step 114 in which a feature is etched into the ILD layer. The etching process transfers the pattern of the layer set to the ILD layer. The etching process removes at least a portion of the layer set. The etching process is a wet etching or dry etching process. In some embodiments, the etching process is a two-step etching process. A first etching includes etching an upper portion of the ILD layer with an etchant having low etching selectivity and a high etch rate. A second etching includes etching a lower portion of the ILD layer with an etchant having a higher selectivity and a lower etch rate. The two step etching process allows faster processing time in comparison with a process using only the highly selective etchant. The two step etching process also reduces the risk of over etching the ILD layer and damaging underlying layers in comparison with an etching process using only the low selectivity etchant. In some embodiments, an etchant used in the first etching is $CF_4$, which will also remove portions of the layer set. In some embodiments, an etchant used in the second etching is hexa-fluoro-butadiene ($C_4F_6$).

FIG. 2E is a cross sectional view of semiconductor device 200 following step 114, in accordance with one or more embodiments. The etching process forms an opening 226 through ILD layer 206. The etching process of step 114 also removes top layer 212 and at least a portion of bottom layer 210. Sidewalls of opening 226 are substantially vertical, such that a width of opening 226 is constant from the top surface of ILD layer 206 to a bottom surface of the ILD layer.

Method 100 continues with optional step 116 in which ashing is performed to remove any remaining portion of the layer set to expose the top surface of the ILD layer. In some embodiments, the etching of step 114 will completely remove the layer set and step 116 is omitted. In some embodiments, the etching of step 114 does not completely remove the layer set and the remaining portion of the layer set is removed by ashing. The ashing uses an oxygen-based plasma to remove the remaining portions of the layer set. In some embodiments, the oxygen-based plasma is mixed with $N_2$, $H_2$, CO, $CO_2$, nitrogen oxide (NO), nitrogen dioxide ($NO_2$), ammonium ($NH_3$) or other suitable materials. The ashing process exposes the top surface of the ILD layer.

FIG. 2F is a cross sectional view of semiconductor device 200 following step 116, in accordance with one or more embodiments. The ashing process removes any remaining material of bottom layer 210 to expose the top surface of ILD layer 206. Opening 226 in ILD layer 206 corresponds to either a trench or a via. Opening 226 has a LWR of less than 3 nm.

Figure 3A:
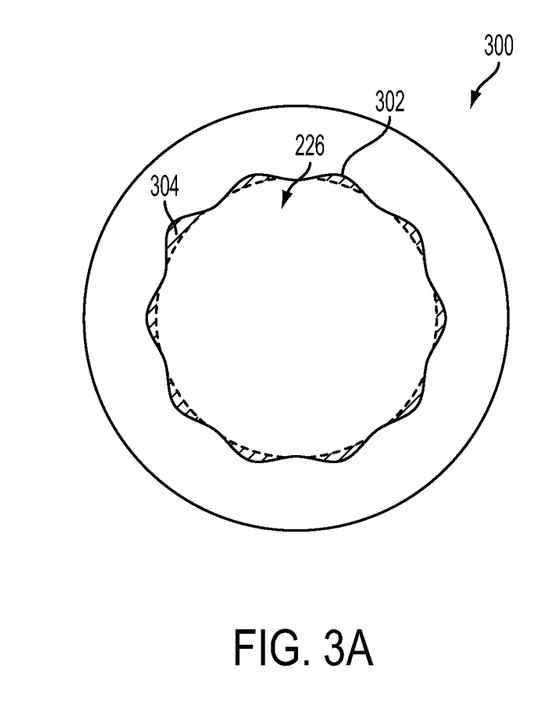
FIG. 3A is a top view of a via formed in an interlayer dielectric layer in accordance with one or more embodiments.

FIG. 3A is a top view of a via 300 formed in ILD layer 206 in accordance with one or more embodiments. Via 300 includes sidewalls 302. Sidewalls 302 are rough as a result of small process variations during the etching process of step 116. In some instances, recessed portions of sidewalls 302 are partially filled with by-product materials 304 which result from the etching process. By-product materials 304 are deposited within the recessed portions of sidewalls 302 during the etching process and the by-product materials reduce the roughness of opening 226. The inventors believe the angle of opening 224 helps to conduct by-product materials 304 into opening 226 which enables a higher degree of filling of the recessed portions of sidewalls 302. The resulting structure of opening 226 has a lower LWR in comparison with techniques which do not include the angle of opening 224.

Figure 3B:
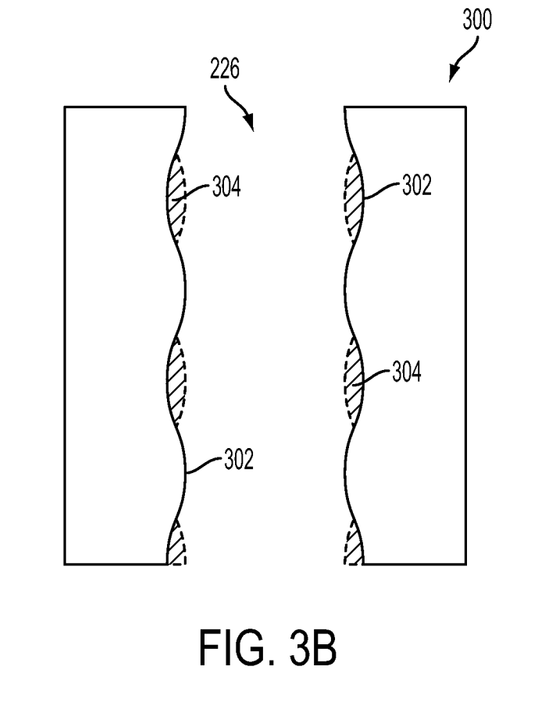
FIG. 3B is a cross section view of a via formed in an interlayer dielectric layer in accordance with one or more embodiments.

FIG. 3B is a cross sectional view of via 300 formed in ILD layer 206 in accordance with one or more embodiments. The cross sectional view of via 300 shows that by-product materials 304 partially fill in recessed portions of sidewalls 302 along an entire depth of opening 226.

In some embodiments, additional processing steps such as metallization steps and chemical-mechanical polishing (CMP) steps are performed to form a final semiconductor device. In some embodiments, method 100 is repeated several times to form several different features in ILD layer 206. In some embodiments, a dual damascene process is used to form additional conductive lines and vias.

Method 100 is advantageous for production processes which utilize advance lithography processes, such as e-beam or EUV lithography. For example, EUV lithography experiences an increased LWR with respect to lithography processes using longer wavelengths. Additionally, processes designed for EUV lithography include thinner layers, which increases the risk of damage during cleaning processes or de-scum processes. These factors make controlling LWR during an EUV lithography process difficult. However, by tapering opening 224 in bottom layer 210, LWR of opening 226 in ILD 206 is effectively controlled to be less than 3 nanometers.

One aspect of this description relates to a method of making a semiconductor device including forming an inter-level dielectric (ILD) layer over a substrate and forming a layer set over the ILD layer. The method further includes etching the layer set to form a tapered opening in the layer set and etching the ILD layer using the layer set as a mask to form an opening in the ILD layer. In some embodiments, the opening in the ILD layer has a line width roughness (LWR) of less than 3 nanometers (nm). In some embodiments, the opening in the ILD layer has an LWR of less than 1 nm.

Another aspect of this description relates to a method of making a semiconductor device including forming an inter-level dielectric (ILD) layer over a substrate and forming a layer set over the ILD layer. The method further includes forming a bottom anti-reflective coating (BARC) layer over the layer set and forming a photoresist layer over the BARC layer. The method further includes forming an opening in the photoresist layer and etching the BARC layer using the photoresist layer as a mask to form an opening in the BARC layer. The method further includes etching the layer set using the BARC layer as a mask to form a tapered opening in the layer set and etching the ILD layer using the layer set as a mask to form an opening in the ILD layer. In some embodiments, the opening in the ILD layer has a line width roughness (LWR) of less than 3 nanometers (nm).

Still another aspect of this description relates to a semiconductor device including an inter-level dielectric (ILD) layer over a substrate; and a layer set over the ILD layer. The layer set has a tapered opening within the layer set. In some embodiments, the ILD layer has an opening having a line width roughness (LWR) of less than 3 nanometers (nm).

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of forming a semiconductor device comprising:
    forming an inter-level dielectric (ILD) layer over a substrate;
    forming a layer set over the ILD layer, wherein the layer set comprises a plurality of layers;
    forming a bottom antireflective coating (BARC) layer over the layer set;
    etching the layer set to form a tapered opening in the layer set, wherein etching the layer set comprises etching at least one layer comprising a silicon-rich photoresist material layer and a second material layer different from the silicon-rich photoresist material; and
    etching the ILD layer using the layer set as a mask to form an opening in the ILD layer, wherein etching the layer set comprises forming the tapered opening having sidewalls at an angle with respect to a top surface of the ILD layer, and etching the ILD layer comprises reducing a thickness of the layer set.

2. The method of claim 1, wherein the etching the layer set comprises using carbonyl sulfide (COS).

3. The method of claim 2, wherein the etching the layer set comprises supplying COS at a flow rate of 5 standard cubic centimeters per minute (sccm) to 50 sccm.

4. The method of claim 1, wherein the opening in the ILD layer has a line width roughness (LWR) of less than 3 nanometers (nm).

5. The method of claim 1, wherein the etching the ILD layer comprises a two step etching process comprising:
    etching a top portion of the ILD layer with a first etchant; and
    etching a bottom portion of the ILD layer with a second etchant different than the first etchant.

6. The method of claim 5, wherein the two step etching process comprises using the first etchant comprising tetrafluoromethane (CF4) and the second etchant comprising hexa-fluoro-butadiene (C4F6).

7. The method of claim 1, wherein etching the second material layer comprises etching a carbon-rich organic material layer.

8. The method of claim 1, wherein reducing the thickness of the layer set comprises removing at least one layer of the plurality of layers.

9. The method of claim 1, wherein etching the layer set comprises reducing a thickness of the BARC layer.

10. A method of making a semiconductor device comprising:
    forming an inter-level dielectric (ILD) layer over a substrate;
    forming a layer set over the ILD layer, wherein the layer set comprises a plurality of layers;
    forming a bottom anti-reflective coating (BARC) layer over the layer set;
    forming a photoresist layer over the BARC layer;
    forming an opening in the photoresist layer;
    etching the BARC layer using the photoresist layer as a mask to form an opening in the BARC layer;
    etching the layer set using the BARC layer as a mask to form a tapered opening in the layer set, wherein etching the layer set comprises etching at least one layer comprising a silicon-rich photoresist material layer and a second material layer different from the silicon-rich photoresist material; and
    etching the ILD layer using the layer set as a mask to form an opening in the ILD layer, wherein etching the layer set comprises forming the tapered opening having an opening in a top surface of the layer set having a first width and an opening in a bottom surface of the layer set having a second width, and etching the ILD layer comprises substantially removing at least one layer of the plurality of layers.

11. The method of claim 10, wherein the etching the layer set comprises using carbonyl sulfide (COS).

12. The method of claim 11, wherein the etching the layer set comprises supplying COS at a flow rate of 5 standard cubic centimeters per minute (sccm) to 50 sccm.

13. The method of claim 10, wherein the opening in the ILD layer has a line width roughness (LWR) of less than 3 nanometers (nm).

14. The method of claim 10, wherein the etching the ILD layer comprises a two step etching process comprising:
    etching a top portion of the ILD layer with a first etchant; and
    etching a bottom portion of the ILD layer with a second etchant different than the first etchant.

15. The method of claim 14, wherein the two step etching process comprises using the first etchant comprising tetrafluoromethane (CF4) and the second etchant comprising hexa-fluoro-butadiene (C4F6).

16. The method of claim 10, wherein etching the second material layer comprises etching a carbon-rich organic material layer.

17. The method of claim 10, further comprising performing an ashing process to remove at least a portion of the layer set.

18. The method of claim 10, wherein the forming the opening in the photoresist layer comprises performing a photolithography process using a light source having an extreme ultraviolet (EUV) wavelength.

19. The method of claim 10, wherein etching the layer set comprises forming the tapered opening having sidewalls at an angle with respect to a top surface of the ILD layer ranging from about 85-degrees to about 90-degrees, but less than 90-degrees.

20. A method of making a semiconductor device comprising:
forming an intermediate semiconductor device, the intermediate semiconductor device comprising:
  an inter-layer dielectric (ILD) layer;
  a layer set over the ILD layer, wherein the layer set comprises:
    a silicon-rich photoresist material layer, and
    a carbon-rich organic material layer;
  a bottom antireflective coating (BARC) layer over the layer set; and
  a photoresist layer over the BARC layer;
etching the layer set to form a tapered opening in the layer set, the tapered opening having sidewalls at an angle with respect to a top surface of the ILD layer, wherein etching the layer set comprises substantially removing the BARC layer; and
etching the ILD layer using the layer set as a mask to form an opening in the ILD layer.

* * * * *